(12) United States Patent
Tai et al.

(10) Patent No.: US 12,349,439 B2
(45) Date of Patent: *Jul. 1, 2025

(54) ELECTRONIC DEVICE

(71) Applicant: Innolux Corporation, Miaoli County (TW)

(72) Inventors: Ming-Jou Tai, Miaoli County (TW); Chia-Hao Tsai, Miaoli County (TW); Yi-Shiuan Cherng, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/614,718

(22) Filed: Mar. 24, 2024

(65) Prior Publication Data
US 2024/0234442 A1 Jul. 11, 2024

Related U.S. Application Data

(63) Continuation of application No. 16/950,907, filed on Nov. 18, 2020, now Pat. No. 11,973,085.

(60) Provisional application No. 62/946,976, filed on Dec. 12, 2019.

(30) Foreign Application Priority Data

Sep. 17, 2020 (CN) .......................... 202010979495.2

(51) Int. Cl.
*H10D 64/23* (2025.01)
*H10D 86/40* (2025.01)

(52) U.S. Cl.
CPC ......... *H10D 64/258* (2025.01); *H10D 86/441* (2025.01); *H10D 86/451* (2025.01)

(58) Field of Classification Search
CPC .......... H01L 29/41775; H01L 27/1248; H10D 64/258; H10D 86/451
See application file for complete search history.

(56) References Cited

U.S. PATENT DOCUMENTS

| | | | |
|---|---|---|---|
| 11,973,085 B2 * | 4/2024 | Tai ....................... | H01L 27/1248 |
| 2016/0204124 A1 * | 7/2016 | Yen ....................... | H01L 27/124 257/40 |
| 2016/0260747 A1 * | 9/2016 | Cai ..................... | H01L 27/1225 |
| 2017/0104046 A1 * | 4/2017 | Seo ..................... | H01L 27/1248 |

* cited by examiner

*Primary Examiner* — Peter M Albrecht
(74) *Attorney, Agent, or Firm* — JCIPRNET

(57) ABSTRACT

An electronic device includes a substrate and a transistor disposed on the substrate. The transistor includes a semiconductor layer, a gate insulating layer, a gate electrode, a first electrode and a second electrode. The gate insulating layer has first contact holes and second contact holes. The first electrode and the second electrode are disposed on the gate electrode and respectively contact the semiconductor layer through the first contact holes and the second contact holes. A minimum distance between a first side of the first electrode and the gate electrode is less than a minimum distance between a first edge of one of the first contact holes and the gate electrode, and a minimum distance between a first side edge of the semiconductor layer and the gate electrode is less than a minimum distance between the first edge of the one of the first contact holes and the gate electrode.

7 Claims, 10 Drawing Sheets

ELECTRONIC DEVICE

CROSS-REFERENCE TO RELATED APPLICATION

This application is a continuation application of and claims the priority benefit of a prior application Ser. No. 16/950,907, filed on Nov. 18, 2020. The prior application Ser. No. 16/950,907 claims the priority benefit of U.S. provisional application Ser. No. 62/946,976, filed on Dec. 12, 2019, and China application Ser. No. 20/2010979495.2, filed on Sep. 17, 2020. The entirety of each of the above-mentioned patent applications is hereby incorporated by reference herein and made a part of this specification.

BACKGROUND

Technical Field

The disclosure relates to an electronic device, and more particularly, to an electronic device having a reduced size.

Description of Related Art

Flat display panels have been widely applied to electronic devices such as mobile phones, televisions, monitors, tablet computers, car displays, wearable devices, and desktop computers. With the vigorous development of electronic products, the requirements for the display quality of electronic products also increase, such that the electronic devices used for display are constantly improving towards larger and higher-resolution display effects.

SUMMARY

The disclosure provides an electronic device which can have a reduced size.

According to an embodiment of the disclosure, an electronic device includes a substrate and a transistor. The transistor is disposed on the substrate. The transistor includes a semiconductor layer, a gate insulating layer, a gate electrode, a first electrode, and a second electrode. The semiconductor layer is disposed on the substrate. The gate insulating layer is disposed on the semiconductor layer and includes a plurality of first contact holes and a plurality of second contact holes. The gate electrode is disposed on the gate insulating layer. The first electrode is disposed on the gate electrode and contacts the semiconductor layer through the plurality of first contact holes. The second electrode is disposed on the gate electrode and contacts the semiconductor layer through the plurality of second contact holes. In a top view, the semiconductor layer has a first side edge, the first electrode has a first side away from the gate electrode, and one of the plurality of first contact holes have first edges away from the gate electrode. In the top view, a minimum distance between the first side of the first electrode and the gate electrode is less than a minimum distance between the first edge of the one of the plurality of first contact holes and the gate electrode, and a minimum distance between the first side edge of the semiconductor layer and the gate electrode is less than a minimum distance between the first edge of the one of the plurality of first contact holes and the gate electrode.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
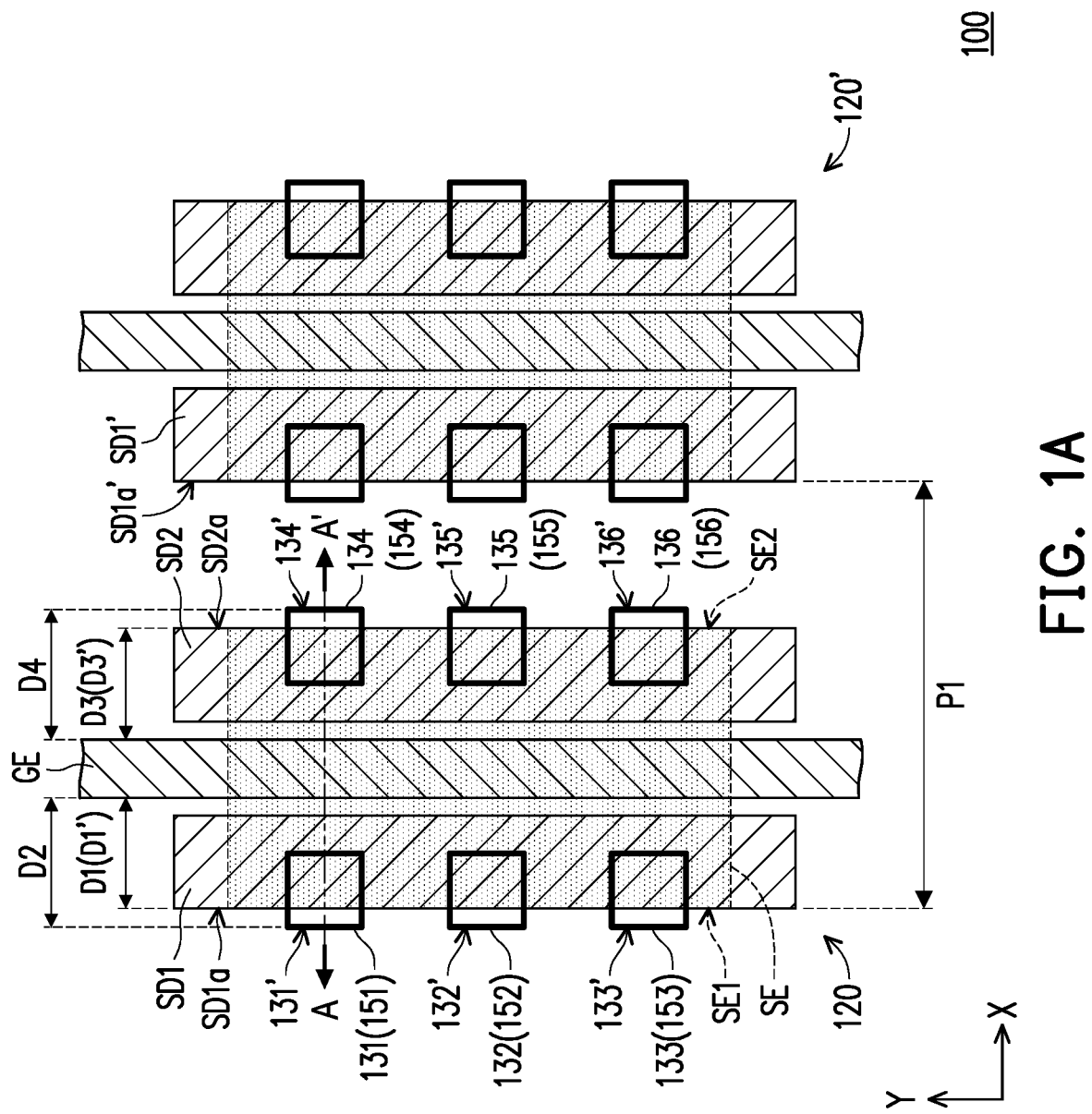
FIG. 1A is a schematic top view of an electronic device according to an embodiment of the disclosure.

The disclosure may be understood by referring to the following detailed description with reference to the accompanying drawings. It is noted that for comprehension of the reader and simplicity of the drawings, in the drawings of the disclosure, only a part of the electronic device is shown, and specific components in the drawings are not necessarily drawn to scale. Moreover, the quantity and the size of each component in the drawings are only schematic and are not intended to limit the scope of the disclosure.

In the following specification and claims, the terms "having", "including", "comprising" etc. are open-ended terms, so they should be interpreted to mean "including but not limited to . . . ".

It should be understood that when a component or a film layer is described as being "on" or "connected to" another component or film layer, it may be directly on or connected to the another component or film layer, or there is an intervening component or film layer therebetween (i.e., indirect on or indirect connection). Conversely, when a component or film layer is described as being "directly on" or "directly connected to" another component or film layer, there is no intervening component or film layer therebetween.

The terms such as "first", "second", "third", etc. may be used to describe components, but the components should not be limited by these terms. The terms are only intended to distinguish a component from another component in the specification. It is possible that the claims do not use the same terms and replace the terms with "first", "second", "third" etc. according to the sequence declared in the claims. Accordingly, in the specification, a first component may be a second component in the claims.

In some embodiments of the disclosure, unless specifically defined, terms related to bonding and connection such as "connect", "interconnect", etc. may mean that two structures are in direct contact, or that two structures are not in direct contact and another structure is provided therebetween. The terms related to bonding and connection may also cover cases where two structures are both movable or two structures are both fixed. In addition, the term "couple" includes any direct and indirect electrical connection means.

In the disclosure, the length and width may be measured by an optical microscope, and the thickness may be measured based on a cross-sectional image in an electron microscope, but the disclosure is not limited thereto. In addition, there may be a certain error between any two values or directions used for comparison.

In the disclosure, the electronic device may include a display device, an antenna device, a sensing device, a touch display, a curved display, or a free shape display, but is not limited thereto. The electronic device may include a bendable or flexible electronic device. The electronic device may include, for example, a light-emitting diode (LED), a liquid crystal, a fluorescence, a phosphor, a quantum dot (QD), other suitable display media, or a combination of the above, but is not limited thereto. The light-emitting diode may include, for example, an organic light-emitting diode (OLED), inorganic light-emitting diode (LED), a mini LED, a micro LED or a quantum dot LED (e.g., QLED or QDLED), other suitable materials, or any combination of the above, but is not limited thereto. The display device may include, for example, a splicing display device, but is not limited thereto. The antenna device may include, for example, a liquid crystal antenna, but is not limited thereto. The antenna device may include, for example, an antenna splicing device, but is not limited thereto. It is noted that the electronic device may be any combination of the above, but is not limited thereto. In addition, the shape of the electronic device may be rectangular, circular, polygonal, a shape with curved edges, or other suitable shapes. The electronic device may have peripheral systems such as a driving system, a control system, a light source system, a rack system, etc. to support a display device, an antenna device, or a splicing device. Hereinafter, an electronic device will be described to illustrate the content of the disclosure, but the disclosure is not limited thereto.

In the disclosure, the features in multiple different embodiments descried below may be replaced, combined, and/or mixed to form other embodiments without departing from the spirit of the disclosure. The features of the embodiments may be arbitrarily mixed and combined as long as they do not depart from or conflict with the spirit of the disclosure.

Reference will now be made in detail to the exemplary embodiments of the disclosure, examples of which are illustrated in the accompanying drawings. Whenever possible, the same reference numerals are used to represent the same or similar parts in the accompanying drawings and description.

Figure 1B:
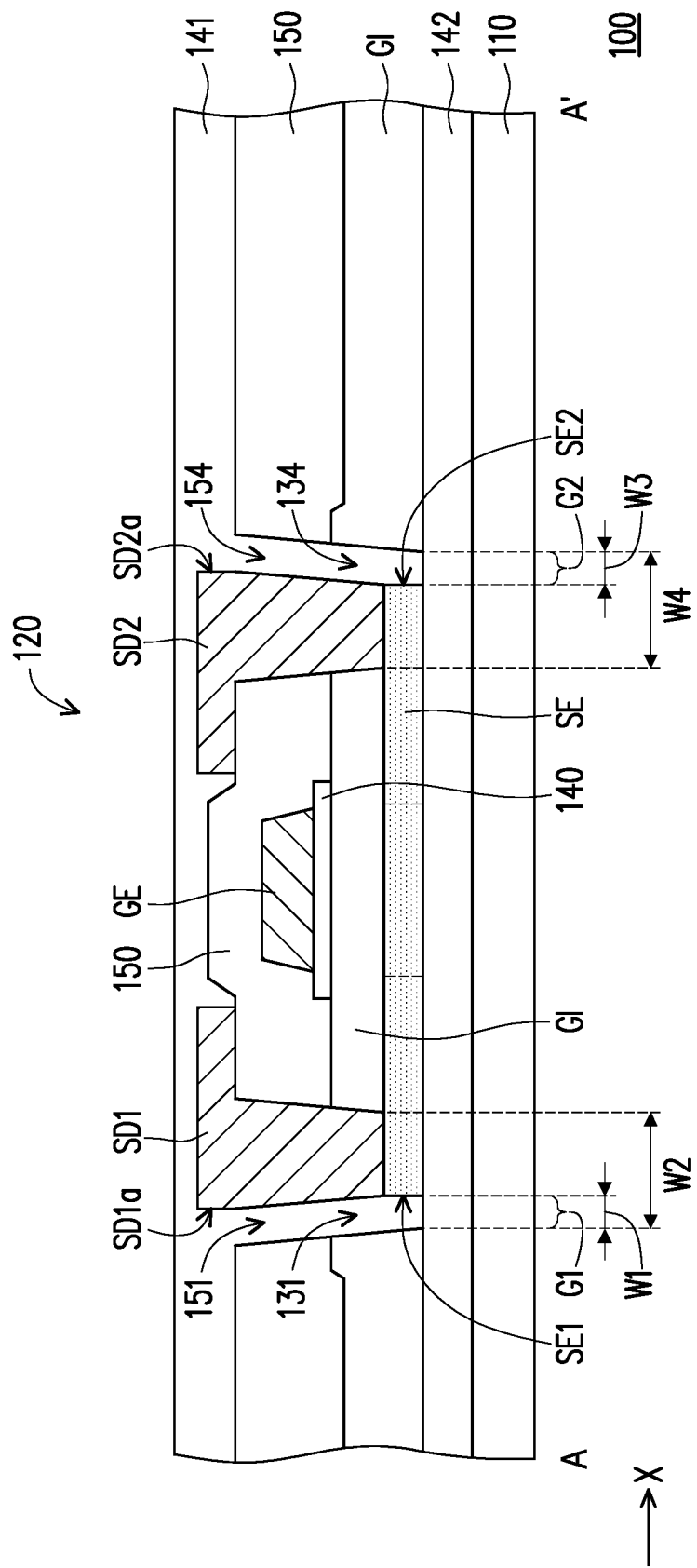
FIG. 1B is a schematic cross-sectional view of the electronic device of FIG. 1A along section line A-A'.

FIG. 1A is a schematic top view of an electronic device according to an embodiment of the disclosure. FIG. 1B is a schematic cross-sectional view of the electronic device of FIG. 1A along section line A-A'. For clarity of the drawings and convenience of description, some components of the electronic device are not shown in FIG. 1A.

Referring to FIG. 1A and FIG. 1B at the same time, an electronic device 100 of this embodiment includes a substrate 110 and a plurality of transistors 120 and 120'. The substrate 110 may include a rigid substrate, a flexible substrate, or a combination thereof. For example, the material of the substrate 110 may include glass, quartz, sapphire, ceramic, polycarbonate (PC), polyimide (PI), polyethylene terephthalate (PET), other suitable substrate materials, or a combination of the above, but is not limited thereto.

In this embodiment, the plurality of transistors 120 and 120' are disposed on the substrate 110. The plurality of transistors 120 and 120' may be disposed in a non-display region (not shown) of the electronic device 100, but are not limited thereto. For example, the plurality of transistors 120 and 120' may be disposed in de-multiplexer circuits (demux) and/or anti-electrostatic discharge circuits (not shown) in the non-display region, but are not limited thereto. In some embodiments, the plurality of transistors 120 and 120' may also be disposed in a display region and/or a non-display region (not shown) of the electronic device 100. Although FIG. 1A schematically shows two transistors, the disclosure does not limit the number of the transistors. In the following description, the transistor 120 will be described as an example.

In this embodiment, the transistor 120 includes a semiconductor layer SE, a gate insulating layer GI, a gate electrode GE, a first electrode SD1, and a second electrode SD2. The semiconductor layer SE is disposed on the substrate 110. The semiconductor layer SE has a first side edge SE1 and a second side edge SE2 opposite to the first side edge SE1. The first side edge SE1 is adjacent to the first electrode SD1, and the second side edge SE2 is adjacent to the second electrode SD2. The material of the semiconductor layer SE may include amorphous silicon, low temperature polysilicon (LTPS), metal oxide (e.g., indium gallium zinc oxide (IGZO)), other suitable materials, or a combination of the above, but is not limited thereto.

In this embodiment, the gate insulating layer GI is disposed on the semiconductor layer SE and covers a buffer layer 142. The gate insulating layer GI has a plurality of first contact holes 131, 132, and 133 and a plurality of second contact holes 134, 135, and 136. The plurality of first contact holes 131, 132, and 133 and the plurality of second contact holes 134, 135, and 136 respectively expose part of the semiconductor layer SE and part of the buffer layer 142. In addition, in the top view of the electronic device 100 (as shown in FIG. 1A), the plurality of first contact holes 131, 132, and 133 are respectively arranged along the extending direction (a direction Y) of the gate electrode GE, and a plurality of second contact holes 134, 135, and 136 are respectively arranged along the extending direction (the direction Y) of the gate electrode GE. The plurality of first contact holes 131, 132, and 133 and the plurality of second contact holes 134, 135, and 136 are respectively disposed on two opposite sides of the gate electrode GE. In a direction X, the first contact hole 131 and the second contact hole 134 are correspondingly disposed, and the first contact hole 132 and the second contact hole 135 are correspondingly disposed, and the first contact hole 133 and the second contact hole 136 are correspondingly disposed, but the disclosure is not limited thereto. The direction X may be the extending direction of section line A-A', the direction X is different from the direction Y, and the direction X is perpendicular to the direction Y. In addition, although FIG. 1A schematically shows three first contact holes 131, 132, and 133 and three second contact holes 134, 135, and 136, the disclosure does not limit the numbers of the first contact holes and the second contact holes. In addition, the gate insulating layer GI may have a single-layer or multi-layer structure, and may include, for example, an organic material, an inorganic material, or a combination of the above, but is not limited thereto.

In this embodiment, the gate electrode GE is disposed on the gate insulating layer GI. In the top view of the electronic device 100 (as shown in FIG. 1A), the gate electrode GE is disposed between the plurality of first contact holes 131, 132, and 133 and the plurality of second contact holes 134, 135, and 136, and the gate electrode GE is disposed between the first electrode SD1 and the second electrode SD2. In some embodiments, the first electrode SD1 may be a source electrode, and the second electrode SD2 may be a drain electrode. In some embodiments, the first electrode SD1 may be a drain electrode, and the second electrode SD2 may be a source electrode.

In this embodiment, the electronic device 100 further includes an insulating layer 140, an insulating layer 141, a buffer layer 142, and a dielectric layer 150. The insulating layer 140 is disposed between the gate electrode GE and the gate insulating layer GI and corresponds to the gate electrode GE. The buffer layer 142 is disposed between the gate insulating layer GI and the substrate 110. In addition, the insulating layer 140, the insulating layer 141, the buffer layer 142, and the dielectric layer 150 may have single-layer or multi-layer structures, and may include, for example, an organic material, an inorganic material, or a combination of the above, but are not limited thereto.

In this embodiment, the dielectric layer 150 is disposed on the gate insulating layer GI, and the dielectric layer 150 covers the gate electrode GE and the insulating layer 140. The dielectric layer 150 has a plurality of first openings 151, 152, and 153 and a plurality of second openings 154, 155, and 156. The plurality of first openings 151, 152, and 153 communicate with the corresponding plurality of first contact holes 131, 132, and 133, and the plurality of second openings 154, 155, and 156 communicate with the corresponding plurality of second contact holes 134, 135, and 136 to respectively expose part of the semiconductor layer SE. In addition, in the top view of the electronic device 100 (as shown in FIG. 1A), the plurality of first openings 151, 152, and 153 are respectively arranged along the extending direction (the direction Y) of the gate electrode GE, and the plurality of second openings 154, 155, and 156 are respectively arranged along the extending direction (the direction Y) of the gate electrode GE. The plurality of first openings 151, 152, and 153 and the plurality of second openings 154, 155, and 156 are respectively disposed on two opposite sides of the gate electrode GE. In the direction X, the first opening 151 and the second opening 154 are correspondingly disposed, the first opening 152 and the second opening 155 are correspondingly disposed, and the first opening 153 and the second opening 156 are correspondingly disposed, but are not limited thereto.

Figure 1C:
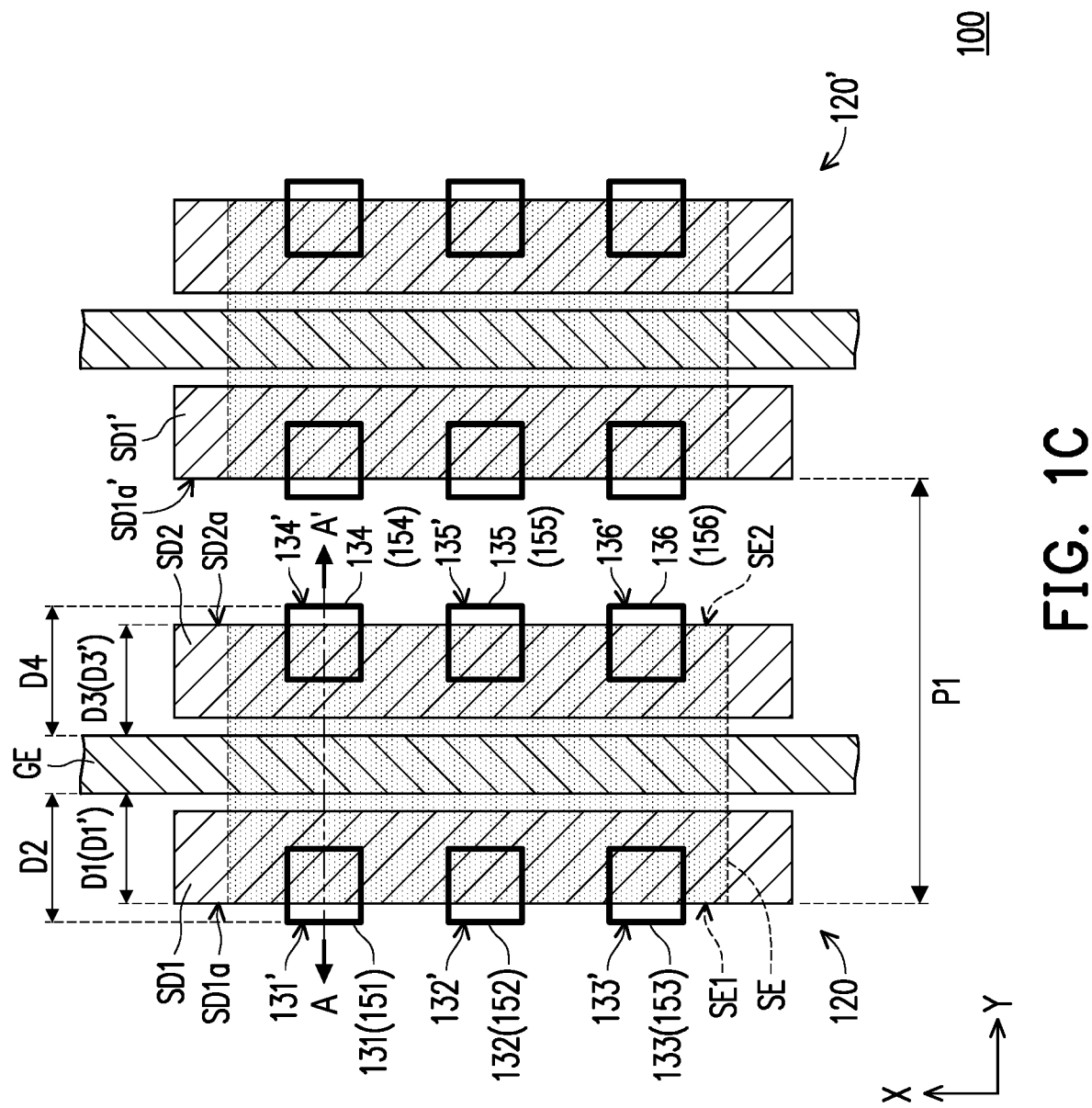
FIG. 1C is a schematic top view of an electronic device according to another embodiment of the disclosure.

In this embodiment, the first electrode SD1 is disposed on the gate electrode GE and the dielectric layer 150, and the first electrode SD1 has a first side SD1a away from the gate electrode GE. As shown in FIG. 1A and FIG. 1B, the transistors 120 and 120' are arranged along the direction X on the substrate 110, and the first electrode SD1 and the second electrode SD2 are kept at a distance from the gate electrode GE, so the side edge of the first electrode SD1 away from the gate electrode GE may be the first side SD1a of the first electrode SD1 away from the gate electrode GE in the direction X, and the side edge of the second electrode SD2 away from the gate electrode GE may be the second side SD2a of the second electrode SD2 away from the gate electrode GE in the direction X. In some embodiments, the first electrode SD1 and the second electrode SD2 are flush with or overlap with the gate electrode GE (not shown), and there are similarly the first side SD1a of the first electrode SD1 away from the gate electrode GE in the direction X and the second side SD2a of the second electrode SD2 away from the gate electrode GE in the direction X. In another embodiment, as shown in FIG. 1C, the transistors 120 and 120' may also be arranged along the direction Y on the substrate 110, so the side edge of the first electrode SD1 away from the gate electrode GE may be the first side SD1a of the first electrode SD1 away from the gate electrode GE in the direction Y, and the side edge of the second electrode SD2 away from the gate electrode GE may be the second side SD2a of the second electrode SD2 away from the gate electrode GE in the direction Y. In some embodiments, the first electrode SD1 and the second electrode SD2 are flush with or overlap with the gate electrode GE (not shown), and there are similarly the first side SD1a of the first electrode SD1 away from the gate electrode GE in the direction Y and the second side SD2a of the second electrode SD2 away from the gate electrode GE in the direction Y. The first electrode SD1 may be further disposed in the plurality of first openings 151, 152, and 153 of the dielectric layer 150 and the plurality of first contact holes 131, 132, and 133 of the gate insulating layer GI, so that the first electrode SD1 can contact the semiconductor layer SE through the plurality of first openings 151, 152, and 153 and the plurality of first contact holes 131, 132, and 133. In this embodiment, the second electrode SD2 is disposed on the gate electrode GE and the dielectric layer 150, and the second electrode SD2 has the second side SD2a away from the gate electrode GE. The second electrode SD2 may be further disposed in the plurality of second openings 154, 155, and 156 of the dielectric layer 150 and the plurality of second contact holes 134, 135, and 136 of the gate insulating layer GI, so that the second electrode SD2 can contact the semiconductor layer SE through the plurality of second openings 154, 155, and 156 and the plurality of second contact holes 134, 135, and 136. In some embodiments, the first openings 151, 152, and 153 of the dielectric layer 150 may be larger than the first contact holes 131, 132, and 133. In some embodiments, the second openings 154, 155, and 156 of the dielectric layer 150 may be larger than the second contact holes 134, 135, and 136, but are not limited thereto. In addition, in the top view of the electronic device 100 (as shown in FIG. 1A), the first electrode SD1 and the second electrode SD2 may be respectively disposed on two opposite sides of the gate electrode GE. In this embodiment, the material of the first electrode SD1 and/or the second electrode SD2 may include a transparent conductive material or a non-transparent conductive material, such as indium tin oxide, indium zinc oxide, indium oxide, zinc oxide, tin oxide, a metal material (e.g., aluminum, molybdenum, copper, silver, etc.), other suitable materials, or a combination of the above, but is not limited thereto. In this embodiment, the structure of the first electrode SD1 and/or the second electrode SD2 may be a single-layer or multi-layer structure, but is not limited thereto. In addition, in this embodiment, in the top view of the electronic device 100 (as shown in FIG. 1A), the bottoms of the plurality of first contact holes 131, 132, and 133 have first edges 131', 132', and 133' away from the gate electrode GE. A minimum distance D1 between the first side SD1a of the first electrode SD1 and the gate electrode GE may be less than a minimum distance D2 between the gate electrode GE and the first edge 131' of one first contact hole 131 among the plurality of first contact holes 131, 132, and 133, but is not limited thereto. In some embodiments, the minimum distance D1 between the first side SD1a of the first electrode SD1 and the gate electrode GE may also be less than the minimum distance D2 between the gate electrode GE and the first edges 131', 132', and 133' of the plurality of first contact holes 131, 132, and 133. In other words, the first electrode SD1 does not fill up the plurality of first openings 151, 152, and 153 and the plurality of first contact holes 131, 132, and 133. In the plurality of first contact holes 131, 132, and 133, a first gap G1 is present between the first side SD1a of the first electrode SD1 and the first edges 131', 132', and 133' of the plurality of first contact holes 131, 132, and 133. In addition, in this embodiment, a width W1 of the first gap G1 is, for example, less than half of a width W2 of the first contact holes 131, 132, and 133. In other words, the width of the first electrode SD1 in the plurality of first contact holes 131, 132, and 133 is, for example, greater than half of the width W2 of the plurality of first contact holes 131, 132, and 133, but is not limited thereto. In this embodiment, the minimum distances D1 and D2 and the widths W1 and W2 are measured along the direction X, for example.

In this embodiment, in the top view of the electronic device 100 (as shown in FIG. 1A), the bottoms of the plurality of second contact holes 134, 135, and 136 have second edges 134', 135', and 136' away from the gate electrode GE. A minimum distance D3 between the second side SD2a of the second electrode SD2 and the gate electrode GE may be less than a minimum distance D4 between the gate electrode GE and the second edge 134' of one second contact hole 134 among the plurality of second contact holes 134, 135, and 136, but is not limited thereto. In some embodiments, the minimum distance D3 between the second side SD2a of the second electrode SD2 and the gate electrode GE may also be less than the minimum distance D4 between the second edges 134', 135', and 136' of the plurality of second contact holes 134, 135, and 136 and the gate electrode GE. In other words, the second electrode SD2 does not fill up the plurality of second openings 154, 155, and 156 and the plurality of second contact holes 134, 135, and 136. In the plurality of second contact holes 134, 135, and 136, a second gap G2 is present between the second side SD2a of the second electrode SD2 and the second edges 134', 135', and 136' of the plurality of second contact holes 134, 135, and 136. A width W3 of the second gap G2 is, for example, less than half of a width W4 of the plurality of second contact holes 134, 135, and 136. In other words, the width of the second electrode SD2 in the plurality of second contact holes 134, 135, and 136 is greater than half of the width W4 of the plurality of second contact holes 134, 135, and 136, but it is not limited thereto. In this embodiment, the minimum distances D3 and D4 and the widths W3 and W4 are measured along the direction X, for example.

In this embodiment, the insulating layer 141 is disposed on the dielectric layer 150, in the first gap G1, and in the second gap G2. The insulating layer 141 covers the first electrode SD1 and the second electrode SD2. The insulating layer 141 and the gate insulating layer GI are respectively located on two opposite sides of the dielectric layer 150.

In this embodiment, the first side SD1a of the first electrode SD1 may be substantially flush with the first side edge SE1 of the semiconductor layer SE, and the second side SD2a of the second electrode SD2 may be substantially flush with the second side edge SE2 of the semiconductor layer SE. Therefore, a minimum distance D1' between the first side edge SE1 of the semiconductor layer SE and the gate electrode GE may be substantially similar to the minimum distance D1 between the first side SD1a of the first electrode SD1 and the gate electrode GE, and a minimum distance D3' between the second side edge SE2 of the semiconductor layer SE and the gate electrode GE may also be substantially similar to the minimum distance D3 between the second side SD2a of the second electrode SD2 and the gate electrode GE. Accordingly, in this embodiment, the minimum distance D1' between the first side edge SE1 of the semiconductor layer SE and the gate electrode GE may also be less than the minimum distance D2 between the gate electrode GE and the first edges 131', 132', and 133' of plurality of first contact holes 131, 132, and 133, and the minimum distance D3' between the second side edge SE2 of the semiconductor layer SE and the gate electrode GE may also be less than the minimum distance D4 between the gate electrode GE and the second edges 134', 135', and 136' of the plurality of second contact holes 134, 135, and 136, but is not limited thereto. In this embodiment, the minimum distances D1' and D3' are measured along the direction X, for example. In some embodiments, the first side SD1a of the first electrode SD1 may be smaller than the first side edge SE1 of the semiconductor layer SE, and the second side SD2a of the second electrode SD2 may be smaller than the second side edge SE2 of the semiconductor layer SE, but is not limited thereto.

In this embodiment, in the top view of the electronic device 100 (as shown in FIG. 1A), the transistor 120 and the transistor 120' are disposed adjacent to each other. A pitch P1 between the transistor 120 and the transistor 120' may be the minimum distance between the first side SD1a of the first electrode SD1 of the transistor 120 and the first side SD1a' of the first electrode SD1' of the transistor 120', and the minimum distance can prevent a short circuit between the transistor 120 and the transistor 120'. In this embodiment, since the minimum distance D1 is less than the minimum distance D2, and the minimum distance D3 is less than the minimum distance D4, the size of the transistors 120 and 120' in the electronic device 100 of this embodiment can be reduced. Accordingly, the pitch P1 between the transistor 120 and the transistor 120' adjacent to each other can also be reduced, for example, by 1 μm to 5 μm in this embodiment, but is not limited thereto.

In brief, in the electronic device 100 of the embodiment of the disclosure, by configuring the minimum distance D1 between the first side SD1a of the first electrode SD1 and the gate electrode GE to be less than the minimum distance D2 between the gate electrode GE and the first edges 131', 132', and 133' of the first contact holes 131, 132, and 133, it is possible to reduce the size of the transistors 120 and 120' and reduce the pitch P1 between the two adjacent transistors 120 and 120'. In addition, by configuring the minimum distance D3 between the second side SD2a of the second electrode SD2 and the gate electrode GE to be less than the minimum distance D4 between the gate electrode GE and the second edges 134', 135', and 136' of the second contact holes 134, 135, and 136, it is also possible to reduce the size of the transistors 120 and 120' and reduce the pitch P1 between the two adjacent transistors 120 and 120'. Therefore, through the above method, the electronic device 100 of the embodiment of the disclosure can have a smaller size.

Other embodiments will be provided below for description. It is noted herein that the reference numerals and part of the descriptions of the above embodiment apply to the following embodiments, where the same numerals are used to represent the same or similar components, and descriptions of the same technical contents are omitted. Reference may be made to the above embodiment for the descriptions of the omitted contents, which will not be repeated in the following embodiments.

Figure 2:
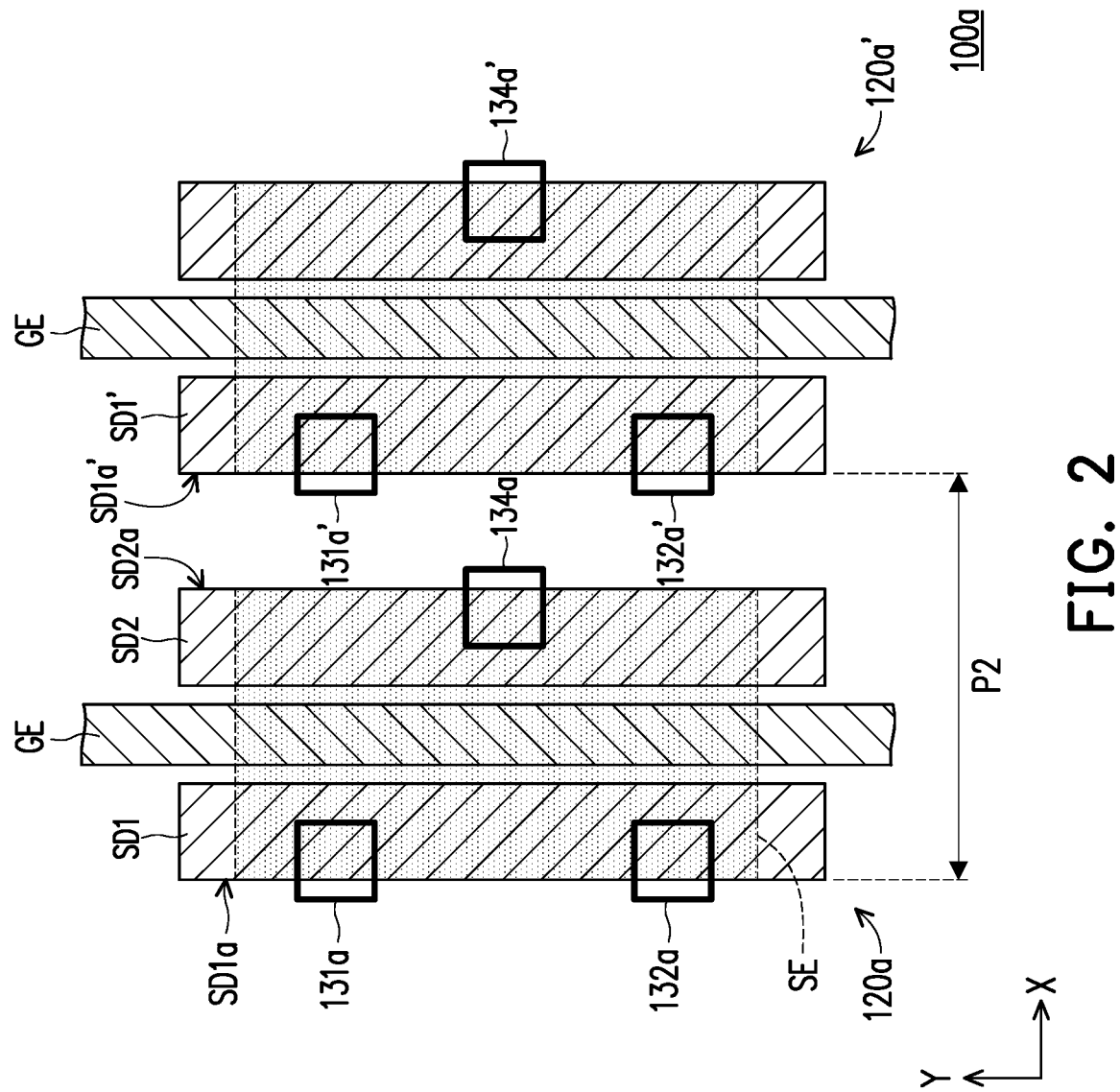
FIG. 2 is a schematic top view of an electronic device according to another embodiment of the disclosure.

FIG. 2 is a schematic top view of an electronic device according to another embodiment of the disclosure. Referring to FIG. 1A and FIG. 2 at the same time, an electronic device 100a of this embodiment is substantially similar to the electronic device 100 of FIG. 1A, so the same and similar components in the two embodiments will not be repeatedly described herein. In the top view of the electronic device 100a of this embodiment, a plurality of first contact holes 131a and 132a (or 131a' and 132a') and a plurality of second contact holes 134a (or 134a') are arranged in a staggered manner.

Specifically, referring to FIG. 2, in the direction X, the first contact hole 131a of a transistor 120a is not disposed corresponding to the second contact hole 134a, the first contact hole 132a is not disposed corresponding to the second contact hole 134a, and the first contact hole 131a and the first contact hole 132a may be staggered with the second contact hole 134a. Therefore, between the transistor 120a and a transistor 120a' adjacent to each other, the second contact hole 134a of the transistor 120a is also staggered with the first contact hole 131a' and the first contact hole 132a' of the transistor 120a'. Accordingly, the pitch between the second side SD2a of the second electrode SD2 of the transistor 120a and the first side SD1a' of the first electrode SD1' of the transistor 120a' can be reduced, so that a pitch P2 between the transistor 120a and the transistor 120a' adjacent to each other in the electronic device 100a of this embodiment can be less than the pitch P1 between the transistor 120 and the transistor 120' adjacent to each other in the electronic device 100 of FIG. 1A, and, for example, the pitch P2 may be 1 μm to 3 μm less than the pitch P1, but is not limited thereto. In some embodiments, in the top view of the electronic device 100a (as shown in FIG. 2), a virtual line extending along the direction X may pass through the first contact hole 131a and the second electrode SD2, but may not pass through the second contact hole 134a.

Figure 3:
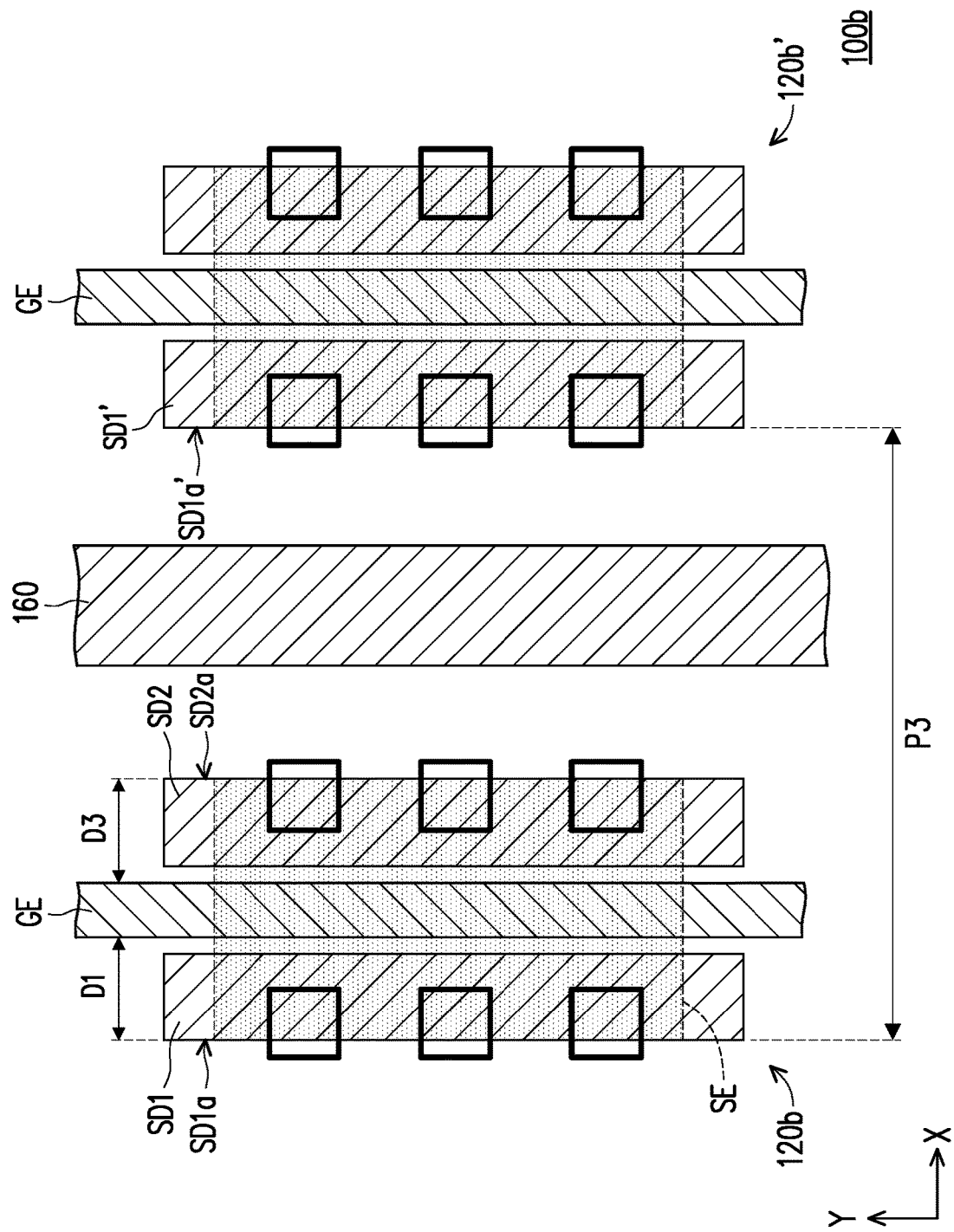
FIG. 3 is a schematic top view of an electronic device according to another embodiment of the disclosure.

FIG. 3 is a schematic top view of an electronic device according to another embodiment of the disclosure. Referring to FIG. 1A and FIG. 3 at the same time, an electronic device 100b of this embodiment is substantially similar to the electronic device 100 of FIG. 1A, so the same and similar components in the two embodiments will not repeatedly described herein. In the top view of the electronic device 100b of this embodiment, the electronic device 100b further includes a metal line 160.

Specifically, referring to FIG. 3, the metal line 160 is in the same layer as the first electrode SD1 and the second electrode SD2, and the metal line 160 is disposed between a transistor 120b and a transistor 120b'. The metal line 160 extends along the direction Y and is substantially parallel to the gate electrode GE. Since the size of the transistors 120b and 120b' in the electronic device 100b of this embodiment may be less than the size of the transistors in the conventional electronic device, a pitch P3 between the transistor 120b and the transistor 120b' adjacent to each other (i.e., the minimum distance between the first side SD1a of the first electrode SD1 of the transistor 120b and the first side SD1a' of the first electrode SD1' of the transistor 120b') can also be less than the pitch between two adjacent transistors in the conventional electronic device, and for example, is less than 1 μm to 5 μm, but is not limited thereto.

Figure 4A:
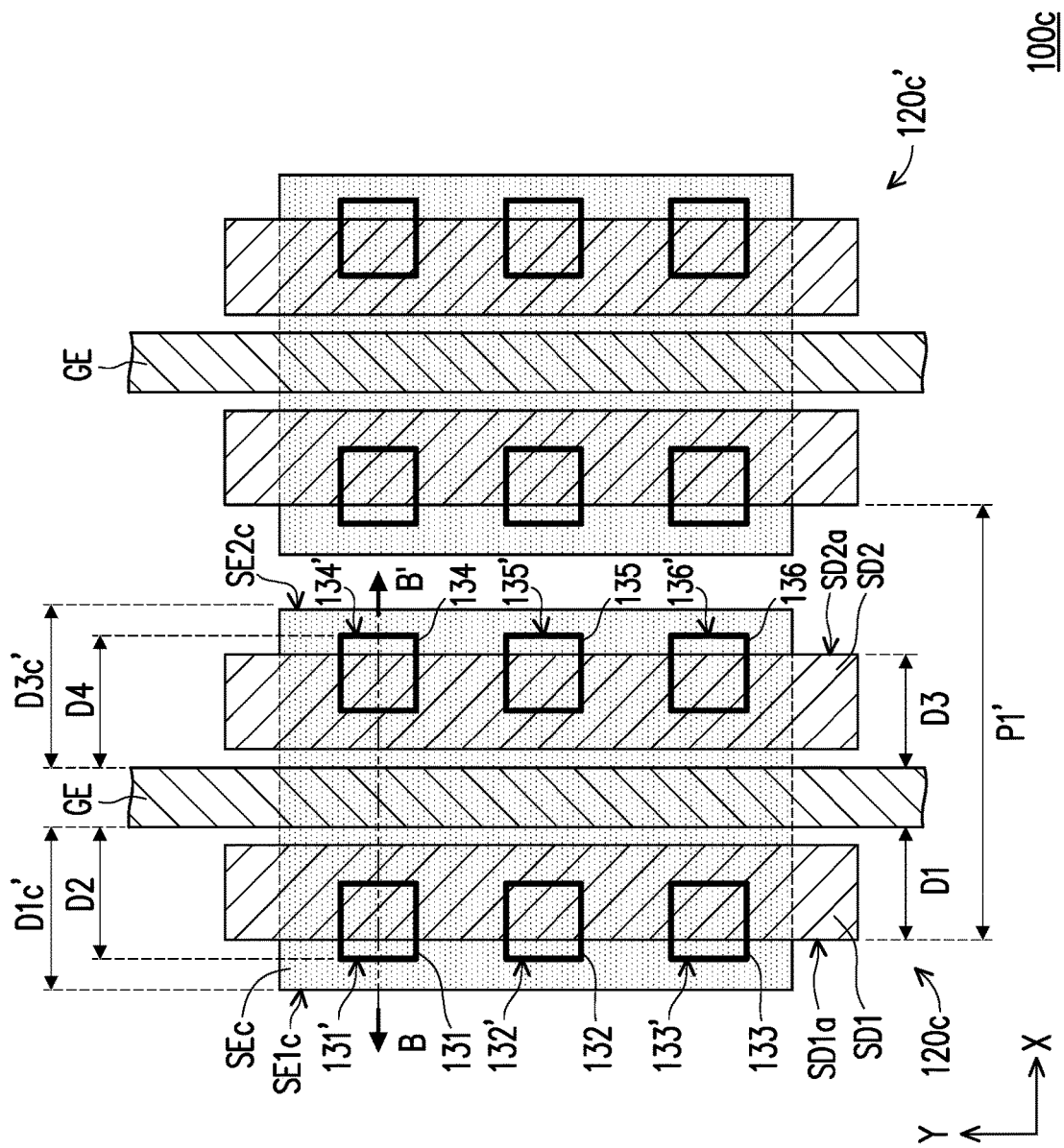
FIG. 4A is a schematic top view of an electronic device according to another embodiment of the disclosure.
Figure 4B:
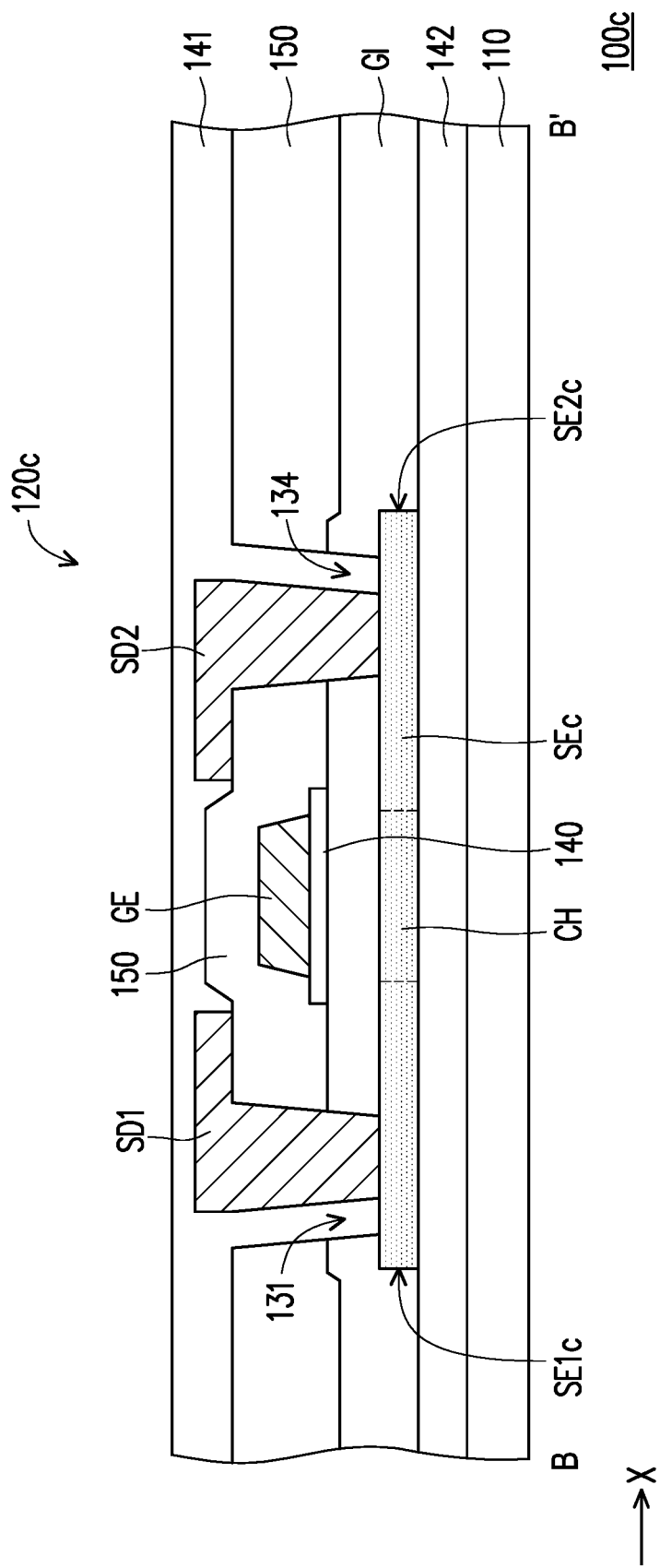
FIG. 4B is a schematic cross-sectional view of the electronic device of FIG. 4A along section line B-B'.

FIG. 4A is a schematic top view of an electronic device according to another embodiment of the disclosure. FIG. 4B is a schematic cross-sectional view of the electronic device of FIG. 4A along section line B-B'. Referring to FIG. 1A to FIG. 1B and FIG. 4A to FIG. 4B at the same time, an electronic device 100c of this embodiment is substantially similar to the electronic device 100 of FIG. 1A to FIG. 1B, so the same and similar components in the two embodiments will not be repeatedly described herein. In the top view of the electronic device 100c of this embodiment, a minimum distance D1c' between a first side edge SE1c of a semiconductor layer SEc and the gate electrode GE of a transistor 120c is greater than the minimum distance D2 between the gate electrode GE and first edges 131', 132', and 133' of the first contact holes 131, 132, and 133, and a minimum distance D3c' between the second side edge SE2c of the semiconductor layer SE and the gate electrode GE is greater than the minimum distance D4 between the gate electrode GE and the second edges 134', 135', and 136' of the second contact holes 134, 135, and 136.

Specifically, referring to FIG. 4A and FIG. 4B at the same time, the first side edge SE1c and the second side edge SE2c of the semiconductor layer SEc may respectively extend away from the gate electrode GE, so that the first side edge SE1c and the second side edge SE2c of the semiconductor layer SEc can respectively extend to the outside of the first contact holes 131, 132, and 133 and the second contact holes 134, 135, and 136. Therefore, when the gate insulating layer GI is etched to form the first contact holes 131, 132, and 133 and the second contact holes 134, 135, and 136, it can be ensured that the first contact holes 131, 132, and 133 and the second contact holes 134, 135, and 136 of the gate insulating layer GI can be completely formed on the semiconductor layer SEc, so as to avoid further etching the buffer layer 142 below when etching the gate insulating layer GI.

In addition, compared to the electronic device 100 in FIG. 1A to FIG. 1B, since this embodiment does not change the minimum distance D1 between the first side SD1a of the first electrode SD1 and the gate electrode GE, and the minimum distance D3 between the second side SD2a of the second electrode SD2 and the gate electrode GE, a pitch P1' between the transistor 120c and the transistor 120c' of the electronic device 100c of this embodiment may be substantially similar to the pitch P1 between the transistor 120 and the transistor 120' of the electronic device 100 of FIG. 1A to FIG. 1B.

Figure 5:
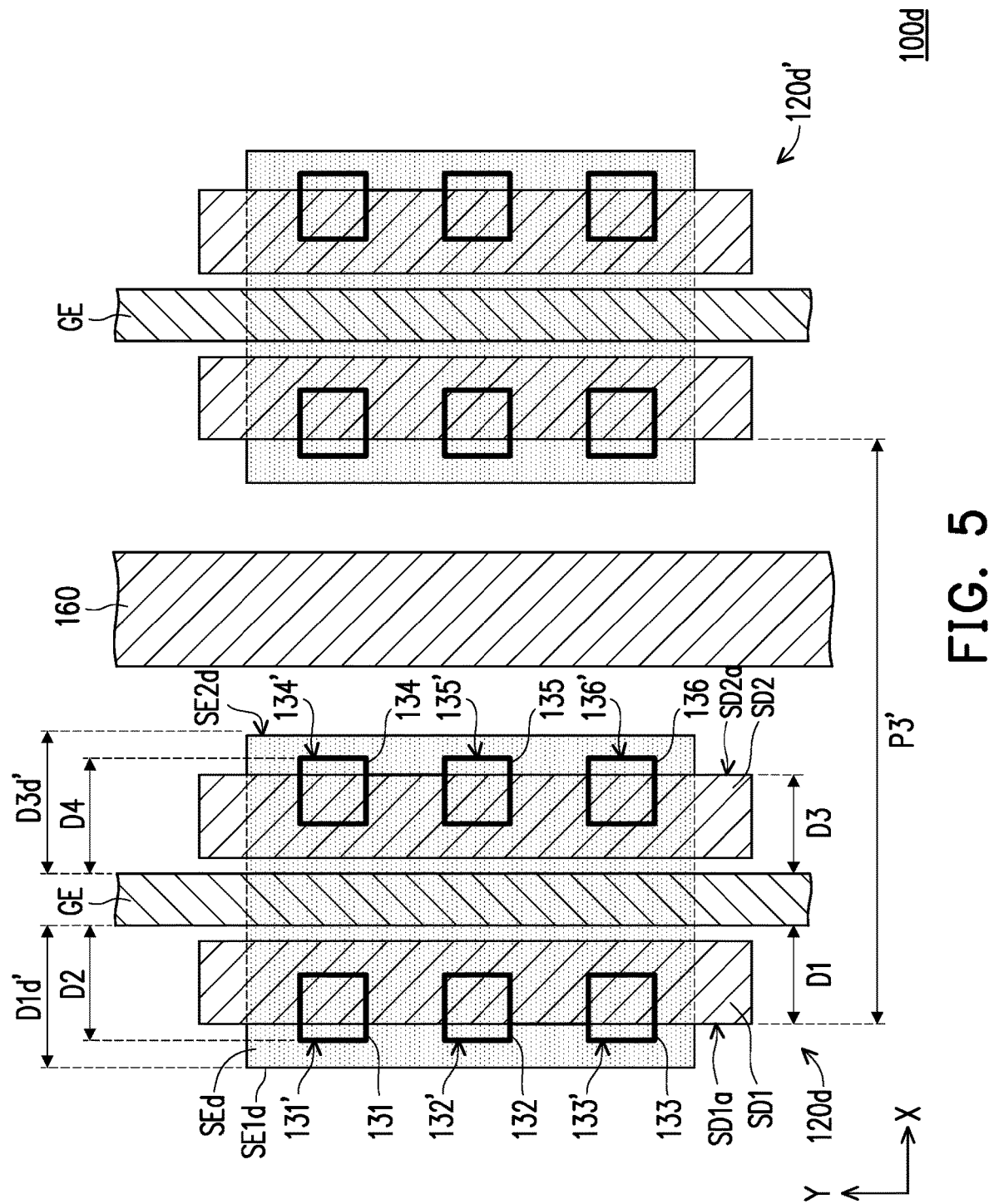
FIG. 5 is a schematic top view of an electronic device according to another embodiment of the disclosure.

FIG. 5 is a schematic top view of an electronic device according to another embodiment of the disclosure. Referring to FIG. 3 and FIG. 5 at the same time, an electronic device 100d of this embodiment is substantially similar to the electronic device 100b of FIG. 3, so the same and similar components in the two embodiments will not be repeatedly described herein. In the top view of the electronic device 100d of this embodiment, a minimum distance D1d' between a first side edge SE1d of a semiconductor layer SEd and the gate electrode GE of a transistor 120d is greater than the minimum distance D2 between the gate electrode GE and the first edges 131', 132', and 133' of the first contact holes 131, 132, and 133, and a minimum distance D3d' between a second side edge SE2d of the semiconductor layer SEd and the gate electrode GE is greater than the minimum distance D4 between the gate electrode GE and the second edges 134', 135', and 136' of the second contact holes 134, 135, and 136.

Specifically, the first side edge SE1d and the second side edge SE2d of the semiconductor layer SEd may respectively extend away from the gate electrode GE, so that the first side edge SE1d and the second side edge SE2d of the semiconductor layer SEd can respectively extend to the outside of the first contact holes 131, 132, and 133 and the second contact holes 134, 135, and 136. Accordingly, when the first contact holes 131, 132, and 133 and the second contact holes 134, 135, and 136 are formed, it can be ensured that the first contact holes 131, 132, and 133 and the second contact holes 134, 135, and 136 can be completely formed on the semiconductor layer SEd, so as to avoid further etching the buffer layer below (not shown) in the etching process.

In addition, compared to the electronic device 100b in FIG. 3, since this embodiment does not change the minimum distance D1 between the first side SD1a of the first electrode SD1 and the gate electrode GE, and the minimum distance D3 between the second side SD2a of the second electrode SD2 and the gate electrode GE, a pitch P3' between the transistor 120d and the transistor 120d' of the electronic device 100d of this embodiment may be substantially similar to the pitch P3 between the transistor 120b and the transistor 120b' of the electronic device 100b in FIG. 3.

Figure 6A:
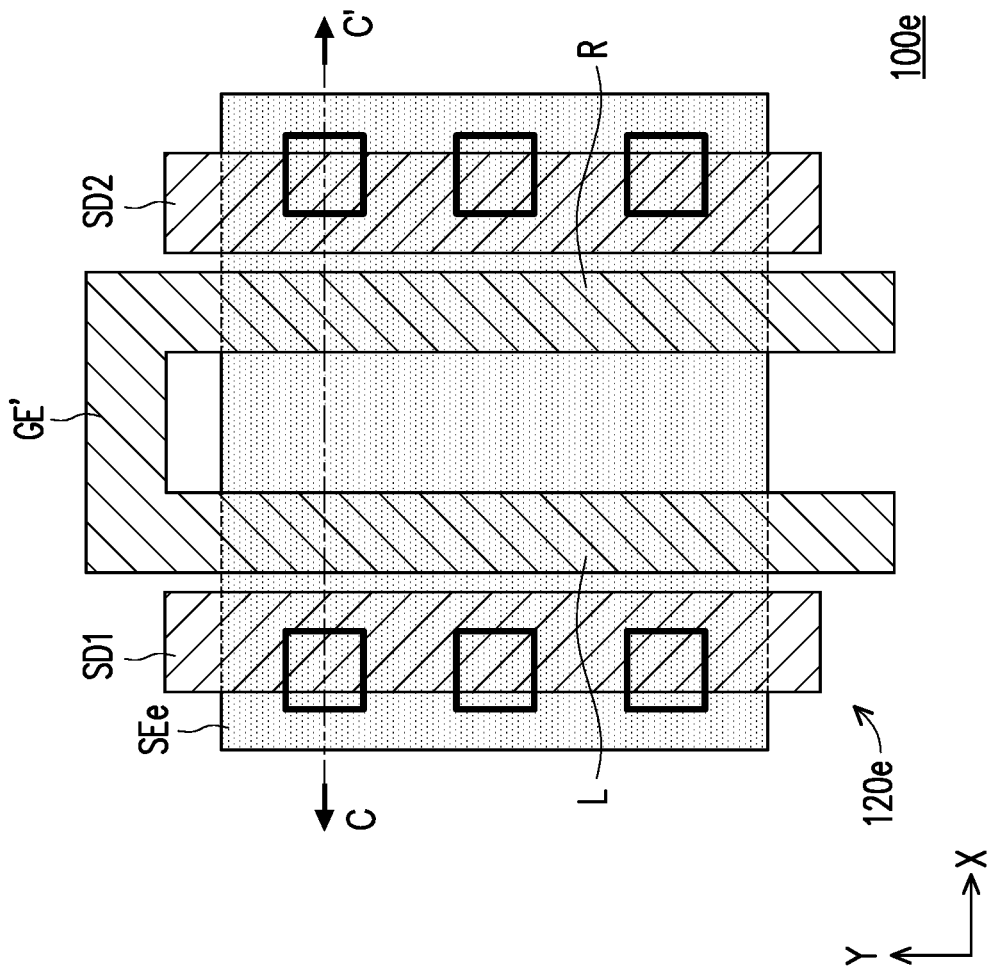
FIG. 6A is a schematic top view of an electronic device according to another embodiment of the disclosure.
Figure 6B:
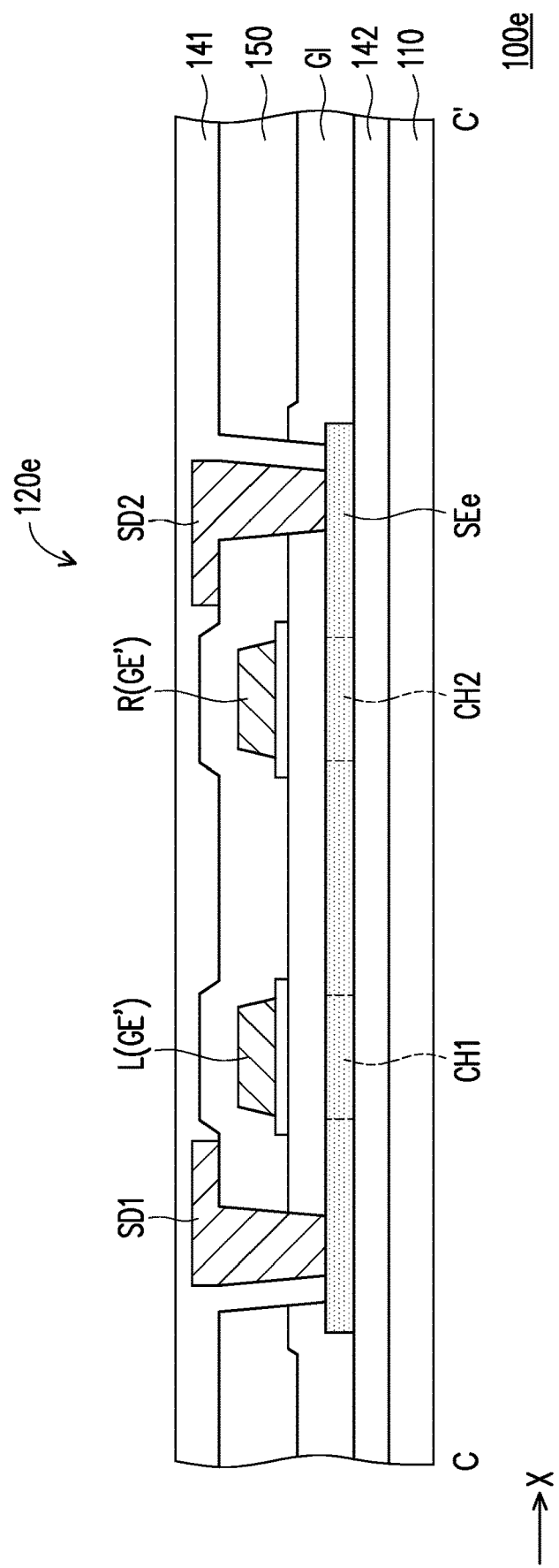
FIG. 6B is a schematic cross-sectional view of the electronic device of FIG. 6A along section line C-C'.

FIG. 6A is a schematic top view of an electronic device according to another embodiment of the disclosure. FIG. 6B is a schematic cross-sectional view of the electronic device of FIG. 6A along section line C-C'. Referring to FIG. 4A to FIG. 4B and FIG. 6A to FIG. 6B at the same time, an electronic device 100e of this embodiment is substantially similar to the electronic device 100c of FIG. 4A to FIG. 4B, so the same and similar components in the two embodiments will not be repeatedly described herein. In the top view of the electronic device 100e of this embodiment, a gate electrode GE' of a transistor 120e has a U-shaped contour.

Specifically, the gate electrode GE' has a left arm L and a right arm R. The left arm L and the right arm R of the gate electrode GE' may respectively correspond to a channel layer CH1 and a channel layer CH2 of a semiconductor layer SEe. Therefore, compared to the semiconductor layer SEc, which serves as one channel layer CH, of the transistor 120c of the electronic device 100c of FIG. 4B, the semiconductor layer SEe of the transistor 120e of the electronic device 100e of this embodiment has a dual-channel structure.

In summary of the above, in the electronic device of the embodiment of the disclosure, by configuring the minimum distance between the first side of the first electrode and the gate electrode to be less than the minimum distance between the first edges of the first contact holes and the gate electrode, it is possible to reduce the size of the transistors and reduce the pitch between two adjacent transistors. In addition, by configuring the minimum distance between the second side of the second electrode and the gate electrode to be less than the minimum distance between the second edges of the second contact holes and the gate electrode, it is also possible to reduce the size of the transistors and reduce the pitch between two adjacent transistors. Therefore, through the above method, the electronic device of the embodiment of the disclosure can have a smaller size.

Finally, it should be noted that the foregoing embodiments are merely used for describing the technical solutions of the disclosure, but are not intended to limit the disclosure. Although the disclosure has been described in detail with reference to the foregoing embodiments, a person of ordinary skill in the art should understand that modifications may still be made to the technical solutions in the foregoing embodiments, or equivalent replacements may be made to part or all of the technical features; and these modifications or replacements will not cause the essence of corresponding technical solutions to depart from the scope of the technical solutions in the embodiments of the disclosure.

What is claimed is:

1. An electronic device comprising:
   a substrate; and
   a transistor disposed on the substrate, wherein the transistor comprises:
      a semiconductor layer disposed on the substrate;
      a gate insulating layer disposed on the semiconductor layer and having a plurality of first contact holes and a plurality of second contact holes;
      a gate electrode disposed on the gate insulating layer;
      a first electrode disposed on the gate electrode and contacting the semiconductor layer through the plurality of first contact holes; and
      a second electrode disposed on the gate electrode and contacting the semiconductor layer through the plurality of second contact holes,
   wherein in a top view, the semiconductor layer has a first side edge, the first electrode has a first side away from the gate electrode, and one of the plurality of first contact holes has a first edge away from the gate electrode,
   wherein in the top view, a minimum distance between the first side of the first electrode and the gate electrode is less than a minimum distance between the first edge of the one of the plurality of first contact holes and the gate electrode, and
   wherein in the top view, a minimum distance between the first side edge of the semiconductor layer and the gate electrode is less than the minimum distance between the first edge of the one of the plurality of first contact holes and the gate electrode.

2. The electronic device according to claim 1, wherein in the top view, the gate electrode extends along a first direction, and the plurality of first contact holes are arranged along the first direction.

3. The electronic device according to claim 2, wherein in the top view, the plurality of second contact holes are arranged along the first direction.

4. The electronic device according to claim 3, wherein in the top view, the one of the plurality of first contact holes and one of the plurality of second contact holes are arranged along a second direction perpendicular to the first direction.

5. The electronic device according to claim 2, wherein in the top view and along a second direction, the plurality of first contact holes and the plurality of second contact holes are arranged in a staggered manner, and the second direction is perpendicular to the first direction.

6. The electronic device according to claim 2, wherein in the top view, a virtual line extending along a second direction passes through the one of the plurality of first contact holes and passes through the second electrode, and the second direction is perpendicular to the first direction.

7. The electronic device according to claim 1, wherein the substrate has a non-display region, and the transistor is disposed within the non-display region.

* * * * *